(12) United States Patent
Kennedy et al.

(10) Patent No.: US 6,377,108 B1
(45) Date of Patent: Apr. 23, 2002

(54) LOW JITTER DIFFERENTIAL AMPLIFIER WITH NEGATIVE HYSTERESIS

(75) Inventors: Joseph T. Kennedy; Stephen R. Mooney, both of Beaverton; Aaron K. Martin; Rajendran Nair, both of Hillsboro, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/649,257

(22) Filed: Aug. 28, 2000

(51) Int. Cl.[7] ............................................... H03K 17/76
(52) U.S. Cl. ......................................... 327/407; 327/99
(58) Field of Search .................................. 327/205, 206, 327/540, 52, 63, 65, 68, 72, 73, 407, 99; 341/167

(56) References Cited

U.S. PATENT DOCUMENTS 4,849,757 A * 7/1989 Krenik ........................ 341/167
5,856,756 A * 1/1999 Sasahara et al. ............. 327/540
6,163,190 A * 12/2000 Takai et al. .................. 320/205

* cited by examiner

Primary Examiner—My-Trang Nu Ton
Assistant Examiner—Hiep Nguyen
(74) Attorney, Agent, or Firm—Schwegman, Lundberg, Woessner & Kluth, P.A.

(57) ABSTRACT

A differential amplifier is provided, incorporating negative hysteresis by automatic reference voltage adjustment. A delayed output signal is routed to a switch or multiplexer which functions to select one of two reference voltage levels, creating negative hysteresis. The delayed output signal is delayed by a series of inverters, which prevent certain embodiments of the invention from oscillating under some conditions. The two reference voltage levels are selected to be near the respective data signal input high and low signal voltage levels, but far enough from these levels so as not to be adversely affected by noise or other interference.

20 Claims, 3 Drawing Sheets

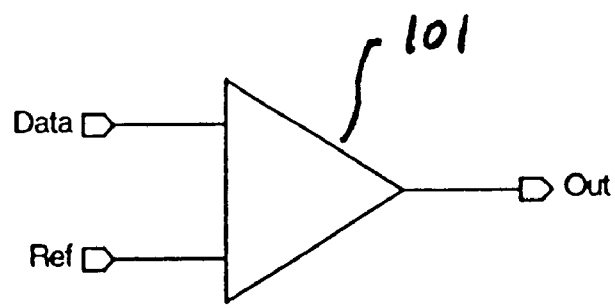
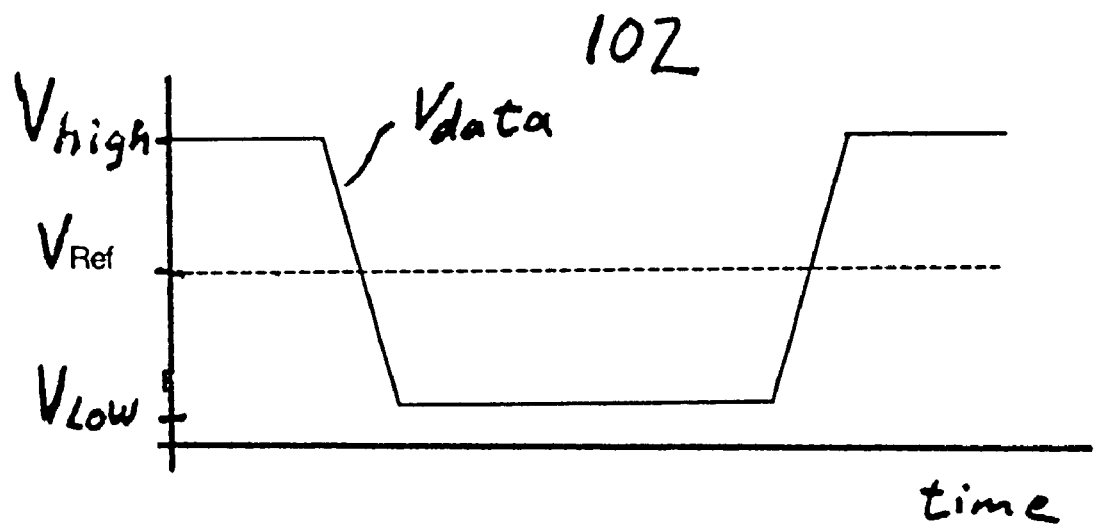
Figure 1: (Prior Art)

LOW JITTER DIFFERENTIAL AMPLIFIER WITH NEGATIVE HYSTERESIS

FIELD OF THE INVENTION

The invention relates generally to electronic amplifier circuits, and more specifically to use of negative hysteresis to create a low jitter amplifier.

BACKGROUND OF THE INVENTION

Electronic circuits, including digital circuits used in modern computers and other digital electronic devices, commonly employ differential amplifiers or comparators to provide an output indicating which of two inputs is of a greater electrical potential. As the name comparator implies, the comparator or differential amplifier in effect compares the two input signals, and indicates which of the inputs is greater in value.

Such devices often bear significant resemblance to operational amplifiers, except that a comparator is specially designed to operate such that the output is either a positive value or negative value, with no linear range in between. This can be implemented with high gain differential amplifier circuits such as are normally employed in operational amplifiers, which are sometimes used in open loop mode (no feedback) as comparators.

These comparator or differential amplifier circuits are often employed in circuits such as analog-to-digital converters, where an analog input signal is compared to a known reference voltage to digitally approximate the analog value of the input signal. Other applications for comparators exist in digital circuits, where they are used as input buffers or receivers for digital data. In this mode, the comparator assures that a received signal that may contain noise or other voltage variations is propagated locally from the comparator as either a logical positive or negative value. Unwanted variations in voltage may include in some circumstances noise from conducted or electromagnetic interference, slow transitions between positive and negative states due to reactance of the transmission medium, and other sources of undesired voltage variation in the signal.

Where slow transitions occur between positive and negative states, it will usually take longer for the transition to be detected by the comparator than is desirable because the reference voltage to which the incoming signal is compared is usually set to a reference value half-way between the positive signal voltage level and the negative signal voltage level. This both provides relatively high immunity against false switching from voltage noise, and equalizes the response time for transitions from positive to negative levels with transitions from negative to positive levels. If this reference voltage is adjusted closer to one signal voltage level than the other it will speed up detection of transitions from that level to the other, but will significantly slow down detection of transitions in the opposite direction.

What is desired is a simple comparator circuit that provide the ability to more quickly detect transitions from one voltage signal level to a second voltage signal level without negatively impacting the ability to quickly detect transitions occurring in the opposite direction.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

The present invention includes a simple differential amplifier circuit that provides the ability to more quickly detect transitions from one voltage signal level to a second voltage signal level without negatively impacting the ability to quickly detect transitions occurring in the opposite direction. The invention does this in various embodiments by switching between different reference voltages based on the output signal of the differential amplifier.

Figure 1A:
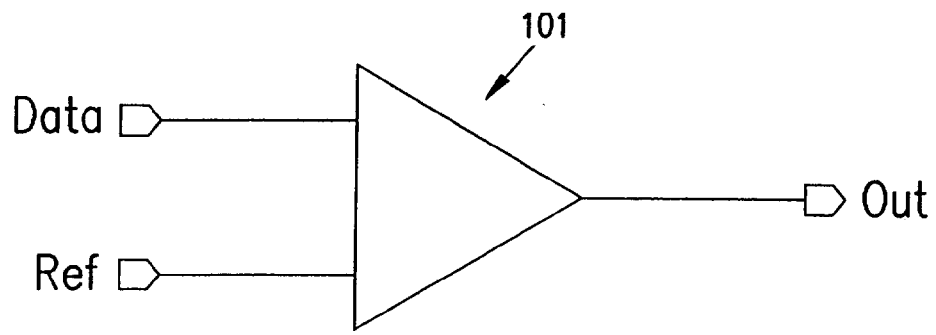
FIG. 1 shows a differential amplifier circuit consistent with the prior art.
Figure 1B:
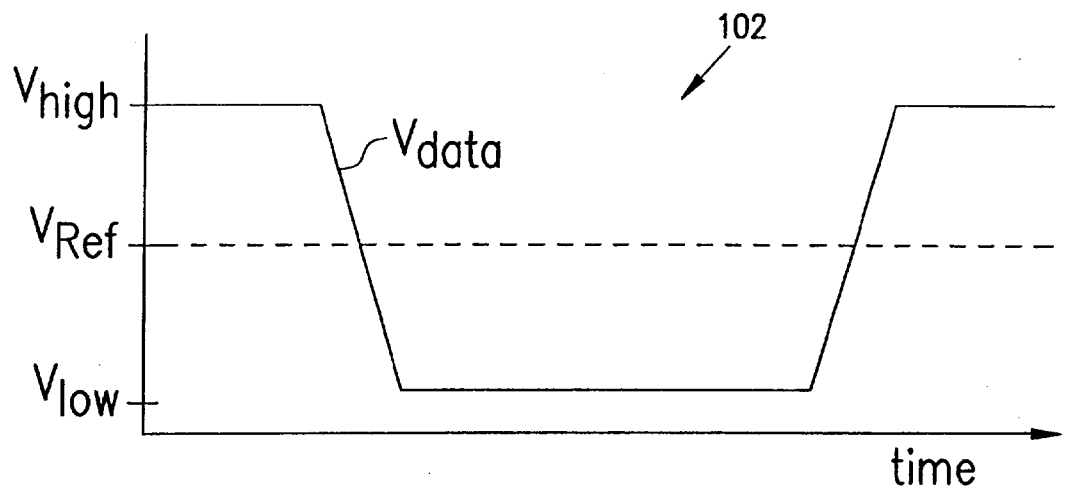
Figure 2A:
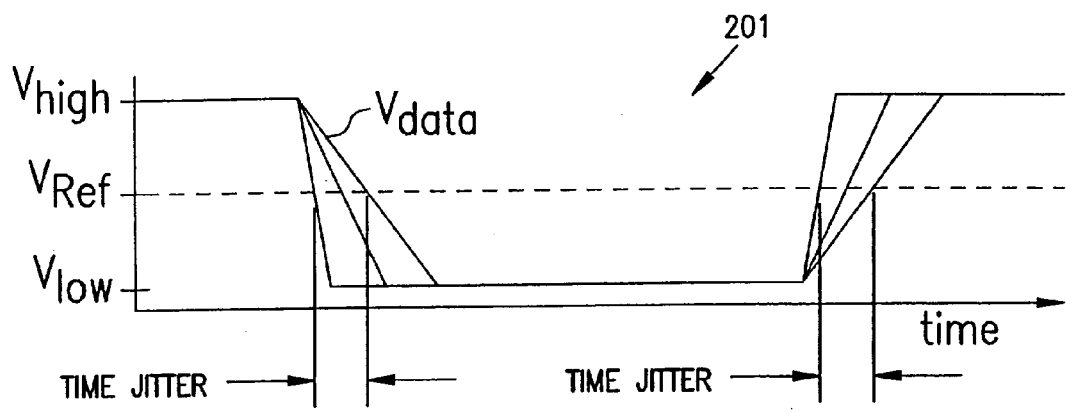
Figure 2B:
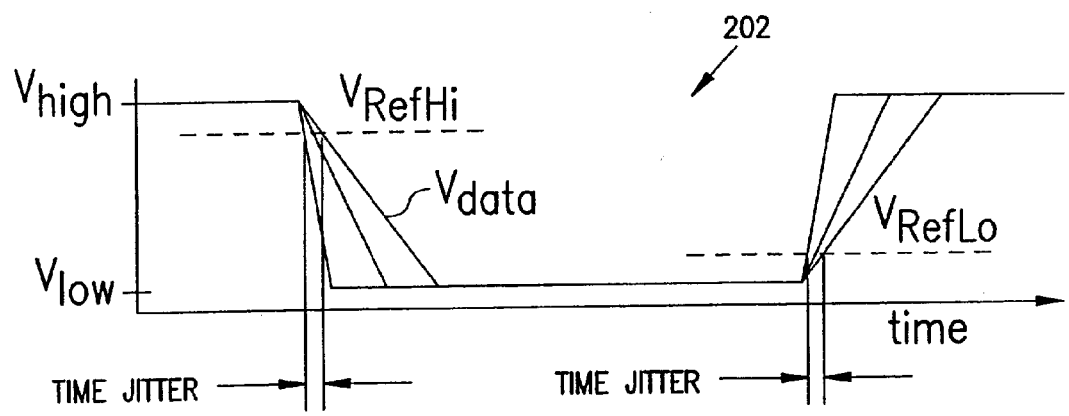
Figure 3:
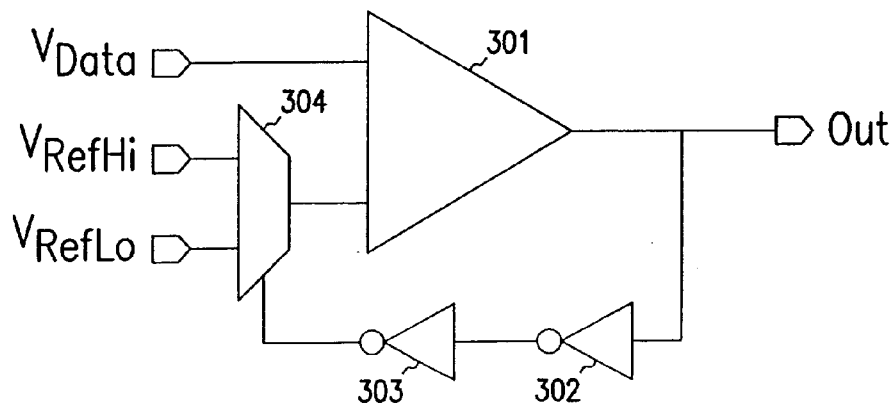

FIG. 1 illustrates at 101 a typical differential amplifier consistent with the prior art having a data input and a reference voltage input, and an output. When the data input voltage is higher than the reference voltage the output is positive, and when the data input voltage is lower than the reference voltage the output is negative.

As discussed earlier, the transition between positive and negative is not necessarily instantaneous, as illustrated at 102. As the data input signal Vdata changes from a high voltage level of Vhigh to a low level Vlow, it eventually crosses Vref, which is the threshold voltage at which the differential amplifier changes state.

Figure 2:
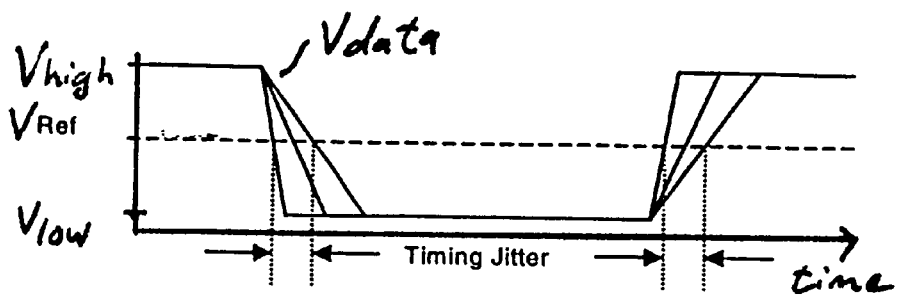
FIG. 2 is a voltage v. timing diagram illustrating the advantages of an embodiment of the present invention over the prior art.
Figure 2:
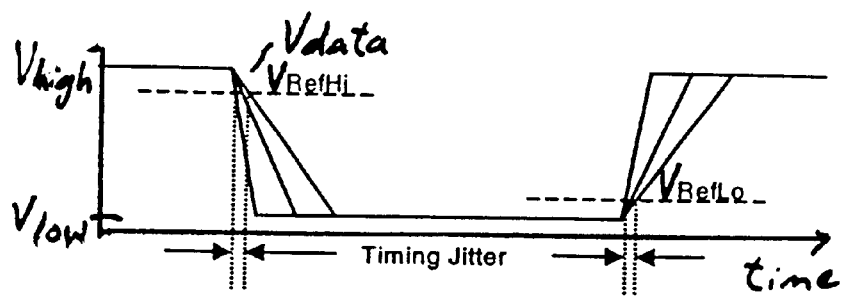

FIG. 2 illustrates how timing jitter is reduced in the present invention by use of negative hysteresis. At 201, a timing diagram for the prior art circuit of FIG. 1 shows how timing jitter is dependent on the time it takes the data signal Vdata to transition from Vhigh or Vlow to the Vref reference voltage level. Because Vref is typically chosen to be halfway between Vhigh and Vlow, the timing jitter for rising and falling Vdata voltage is approximately equal.

At 202, the same data signal Vdata is shown with multiple reference voltages, consistent with an embodiment of the present invention. As Vdata transitions from Vhigh to Vlow, it passes a relatively high reference voltage VrefHi, selected to be near Vhigh but not so close as to make false threshold crossings due to noise or other error likely. Because VrefHi is much nearer Vhigh than Vref was in 201, the timing jitter as shown is reduced substantially.

Similarly, when the data signal Vdata transitions from Vlow to Vhigh at 202, it crosses VrefLo, selected to be near Vlow but again not so near as to make false threshold crossings likely. Because VrefLo is much nearer Vlow than Vref was in 201, the timing jitter is again reduced substantially.

Figure 3:
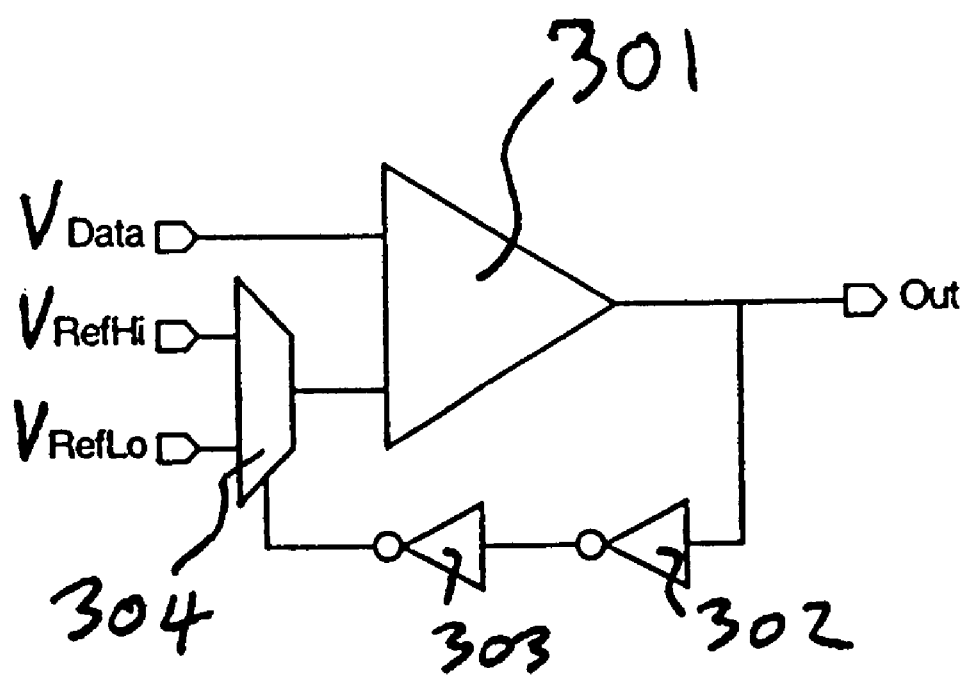
FIG. 3 shows a differential amplifier circuit with negative hysteresis, consistent with an embodiment of the present invention.

In some embodiments of the invention, switching between VrefLo and VrefHi is achieved via a circuit as shown in FIG. 3. The differential amplifier 301 has a first input coupled to receive Vdata, and its output is connected to a first inverter 302. The output of the first inverter 302 is connected to the input of a second inverter 303, the output of which feeds into multiplexer 304. The output of inverter 303 is connected to multiplexer 304 such that the output signal is operable to select either the VrefHi or VrefLo signals connected to the multiplexer for output to a second input to the differential amplifier 301. In some alternate embodiments of the invention, multiplexer 304 is replaced with other switching circuitry operable to switch between VrefHi and VrefLo in response to the output signal from the second inverter 303.

In another embodiment of the invention, the output of the differential amplifier 301 is not connected to a first inverter 302 or a second inverter 303, but is instead connected to some other delay element which is then connected to the multiplexer or switching circuitry 304. Such a configuration maintains the delay introduced into the circuit illustrated in FIG. 3, which is necessary to ensure the multiplexer or switch does not change reference values immediately after a reference value threshold is crossed. If this were allowed to happen, the output of the circuit could potentially oscillate between reference values, resulting in failure of the circuit to ever fully switch states.

The present invention will likely in various embodiments and applications be a component in a larger circuit, such as an element of an integrated circuit that performs other functions. For example, the invention may be used in microprocessors, computer chipsets, or memory controllers within computer systems. It is specifically contemplated that in some instances the data input may be amplified before being input to the circuit described here, especially where the data signal level is relatively low or requires filtering. However, it is anticipated that the present invention will find valuable application wherever comparators or differential amplifiers are used in high speed circuitry or where they are otherwise sensitive to jitter or switching speed.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

What is claimed is:

1. A low-jitter differential amplifier circuit, comprising:
    a differential amplifier having a first input and a second input and an output, the first input operable to receive an input signal;
    a first inverter having an input and an output, the input connected to the output of the differential amplifier;
    a second inverter having an input and an output, the input connected to the first inverter; and
    a multiplexer, the multiplexer comprising a first input coupled to receive a first reference voltage signal and a second input coupled to receive a second reference voltage signal, the multiplexer further comprising an output connected to the second input of the differential amplifier, and the multiplexer further comprising a selector input coupled to the output of the second inverter such that when the output of the second inverter is a logical high the multiplexer outputs the first reference voltage signal and when the output of the second inverter is a logical low the multiplexer outputs the second reference voltage signal.

2. The circuit of claim 1, further comprising a circuit output connected to the differential amplifier output.

3. The circuit of claim 1, further comprising a circuit output connected to the second inverter output.

4. The circuit of claim 1, wherein the first reference voltage signal is selected to be nearer to the logical high signal voltage level than to the logical low signal voltage level, but between the logical high and low voltage signal levels.

5. The circuit of claim 1, wherein the second reference voltage signal is selected to be nearer to the logical low signal voltage level than to the logical high signal voltage level, but between the logical high and low voltage signal levels.

6. The circuit of claim 1, wherein the input signal comprises digital data.

7. A low-jitter differential amplifier circuit, comprising:
    a differential amplifier having a first input and a second input and an output, the first input operable to receive an input signal;
    a delay element having an input connected to the output of the differential amplifier and having an output;
    a multiplexer, the multiplexer comprising a first input coupled to receive a first reference voltage signal and a second input coupled to receive a second reference voltage signal, the multiplexer further comprising an output connected to the second input of the differential amplifier, and the multiplexer further comprising a selector input coupled to the output of the delay element such that when the output of the delay element is a logical high the multiplexer outputs the first reference voltage signal and when the output of the differential amplifier is a logical low the multiplexer outputs the second reference voltage signal.

8. The circuit of claim 7, further comprising a circuit output connected to the differential amplifier output.

9. The circuit of claim 7, wherein the first reference voltage signal is selected to be nearer to the logical high signal voltage level than to the logical low signal voltage level, but between the logical high and low voltage signal levels.

10. The circuit of claim 7, wherein the second reference voltage signal is selected to be nearer to the logical low signal voltage level than to the logical high signal voltage level, but between the logical high and low voltage signal levels.

11. The circuit of claim 7, wherein the input signal comprises digital data.

12. An integrated circuit, comprising:
    a differential amplifier having a first input and a second input and an output, the first input operable to receive an input signal;
    a first inverter having an input and an output, the input connected to the output of the differential amplifier;
    a second inverter having an input and an output, the input connected to the first inverter; and
    a multiplexer, the multiplexer comprising a first input coupled to receive a first reference voltage signal and a second input coupled to receive a second reference voltage signal, the multiplexer further comprising an output connected to the second input of the differential amplifier, and the multiplexer further comprising a selector input coupled to the output of the second inverter such that when the output of the second inverter is a logical high the multiplexer outputs the first reference voltage signal and when the output of the second inverter is a logical low the multiplexer outputs the second reference voltage signal.

13. The integrated circuit of claim 12, wherein the first reference voltage signal is selected to be nearer to the logical high signal voltage level than to the logical low signal voltage level, but between the logical high and low voltage signal levels.

14. The integrated circuit of claim 12, wherein the second reference voltage signal is selected to be nearer to the logical low signal voltage level than to the logical high signal voltage level, but between the logical high and low voltage signal levels.

15. An integrated circuit, comprising:
   a differential amplifier having a first input and a second input and an output, the first input operable to receive an input signal;
   a delay element having an input connected to the output of the differential amplifier and having an output;
   a multiplexer, the multiplexer comprising a first input coupled to receive a first reference voltage signal and a second input coupled to receive a second reference voltage signal, the multiplexer further comprising an output connected to the second input of the differential amplifier, and the multiplexer further comprising a selector input coupled to the output of the delay element such that when the output of the delay element is a logical high the multiplexer outputs the first reference voltage signal and when the output of the differential amplifier is a logical low the multiplexer outputs the second reference voltage signal.

16. The integrated circuit of claim 15, wherein the first reference voltage signal is selected to be nearer to the logical high signal voltage level than to the logical low signal voltage level, but between the logical high and low voltage signal levels.

17. The integrated circuit of claim 15, wherein the second reference voltage signal is selected to be nearer to the logical low signal voltage level than to the logical high signal voltage level, but between the logical high and low voltage signal levels.

18. A method of operating a differential amplifier circuit, comprising:
   receiving an input signal in a first input of the differential amplifier; and
   switching between providing a first reference voltage and a second reference voltage to the second input of the differential amplifier such that the first reference voltage is provided if the output of the differential amplifier is a logical high and the second reference voltage is provided if the output of the differential amplifier is a logical low.

19. The method of claim 18, wherein the first reference voltage signal is selected to be nearer to the logical high signal voltage level than to the logical low signal voltage level, but between the logical high and low voltage signal levels.

20. The integrated circuit of claim 18, wherein the second reference voltage signal is selected to be nearer to the logical low signal voltage level than to the logical high signal voltage level, but between the logical high and low voltage signal levels.

* * * * *

UNITED STATES PATENT AND TRADEMARK OFFICE
CERTIFICATE OF CORRECTION

PATENT NO.    : 6,377,108 B1
DATED         : April 23, 2002
INVENTOR(S)   : Joseph T. Kennedy et al.

It is certified that error appears in the above-identified patent and that said Letters Patent is hereby corrected as shown below:

Drawings,
Delete drawing sheets 1-6, and substitute therefor drawing sheets 1-3, consisting of figures 1A-3, as shown on the attached pages.

Signed and Sealed this

Twenty-eighth Day of January, 2003

JAMES E. ROGAN
*Director of the United States Patent and Trademark Office*